(12) United States Patent
Shikata et al.

(10) Patent No.: US 6,665,183 B1
(45) Date of Patent: Dec. 16, 2003

(54) POWER SUPPLY APPARATUS

(75) Inventors: Kunio Shikata, Osaka (JP); Masao Katooka, Osaka (JP); Yoshimasa Kawashima, Osaka (JP); Hideo Ishii, Osaka (JP)

(73) Assignee: Sansha Electric Manufacturing Company, Limited, Osaka (JP)

( * ) Notice: Subject to any disclaimer, the term of this patent is extended or adjusted under 35 U.S.C. 154(b) by 0 days.

(21) Appl. No.: 10/368,993

(22) Filed: Feb. 19, 2003

(30) Foreign Application Priority Data

Feb. 19, 2002 (JP) .................................. 2002-042075

(51) Int. Cl.[7] .............................................. H05K 7/20
(52) U.S. Cl. ...................... 361/697; 257/721; 363/141
(58) Field of Search ........................... 165/80.2, 80.3, 165/185, 121–126; 174/16.3; 363/141, 144; 257/706, 707, 713, 721, 722–724; 361/695, 697, 703–705, 707–712, 715–719; 454/184

(56) References Cited

U.S. PATENT DOCUMENTS

| | | | |
|---|---|---|---|
| 4,015,173 A | * | 3/1977 | Nitsche ...................... 361/709 |
| 4,772,999 A | | 9/1988 | Fiorina et al. |
| 5,546,275 A | * | 8/1996 | Moutrie et al. ............. 361/707 |
| 5,831,240 A | | 11/1998 | Katooka et al. |
| 5,831,847 A | * | 11/1998 | Love .......................... 363/141 |
| 6,535,409 B2 | * | 3/2003 | Karol ......................... 363/141 |
| 2002/0070836 A1 | | 6/2002 | Fujiyoshi et al. |

FOREIGN PATENT DOCUMENTS

| | | |
|---|---|---|
| GB | 2320143 A | 6/1998 |
| JP | 11346069 A | 12/1999 |

* cited by examiner

*Primary Examiner*—Gerald Tolin
(74) *Attorney, Agent, or Firm*—Duane Morris LLP

(57) ABSTRACT

A power supply apparatus has chassis (42, 44) mounted on opposing surfaces of a heat sink (40). Printed circuit boards (46, 48) are disposed outward of the chassis (42, 44) and detachably secured to the chassis (42, 44). Semiconductor modules (4, 16a, 16b, 32) are mounted on the respective surfaces of the heat sink (40) facing toward the printed circuit boards (46, 48) and extend through the chassis (42, 44). The semiconductor modules (4, 16a, 16b, 32) are electrically connected to the printed circuit boards (46, 48) to form a power supply circuit.

9 Claims, 4 Drawing Sheets

POWER SUPPLY APPARATUS

This invention relates to a power supply apparatus and, more particularly, to a power supply apparatus which may be used with, for example, an arc welder, a plasma arc welder, an arc cutter, a plasma arc cutter, a charger, and a plating apparatus.

BACKGROUND OF THE INVENTION

Some power supply apparatuses provide DC current converted from AC current. Such apparatuses include components which generate a relatively large amount of heat during operation, and components which generate a relatively small amount of heat during operation. For simplification of description in this specification, the former components are referred to simply as heat-generating components, and the latter ones are referred to as less-heat-generating components. A power supply apparatus: including a group of heat-generating components and a group of less-heat-generating components disposed, being separated from each other, in a case has been proposed.

One such example is disclosed in U.S. Pat. No. 5,831,240 assigned to the same assignee as the present application. The power supply apparatus disclosed in this U.S. patent includes front and rear spaced-apart panels. A chassis divides the space defined by and between the front and rear panels into upper and lower spaces. Heat-generating components are disposed in the lower space, and less-heat-generating components are disposed in the upper space. A semiconductor module, which is a heat-generating component, is disposed in the upper space, too. The semiconductor module, however, is mounted on a heat sink. The heat sink extends through the chassis into the lower space. Accordingly, the heat generated by the semiconductor module is effectively released into the lower space. A fan is disposed in association with the lower space for expelling the heat out of the case. The semiconductor module contains all of the semiconductor devices used in the power supply apparatus. Above and near to the semiconductor module, disposed is a printed circuit board containing a control circuit for controlling those semiconductor devices which need to be controlled. The upper and lower spaces are closed by left and right side panels each having a U-shaped cross-section, whose edges are brought to abut each other.

Since the chassis is joined to the front and rear panels, the internal components and structure can be inspected only with the chassis kept joined to the front and rear panels, which makes it difficult to inspect and repair those components which are disposed near the front and rear panels. Also, for replacing the semiconductor module with a new one, it is necessary to first remove the left and right side panels and dismount the printed circuit board disposed above the semiconductor module before replacement. It, therefore, takes a relatively long time to inspect and maintain the power supply apparatus.

An object of the present invention is to provide a power supply apparatus which can be inspected and maintained with ease.

SUMMARY OF THE INVENTION

A power supply apparatus according to the present invention has first and second spaced apart chassis, which may preferably be formed of thin members, e.g. plate-like members. A heat sink is disposed between the first and second chassis, and the first and second chassis are mounted to the heat sink. A printed circuit board is detachably mounted to at least one of said first and second chassis on the surface opposite to the surface by which the chassis is mounted to the heat sink. The printed circuit board is preferably spaced from the heat sink. A semiconductor module is mounted on the surface of the heat sink facing toward the printed circuit board. The semiconductor module is electrically connected to the printed circuit board to form a power supply circuit. The heat sink, the first and second chassis, and the printed circuit board form an assembly, of which lateral sides are covered by a hull. Either a single-unit type hull or a split type hull can be used. The front and rear ends of the assembly, i.e. the front and rear ends of the first and second chassis, respectively, are covered by the front and rear panels. It should be noted that the assembly are separable from the front and rear panels.

Since the first and second chassis are mounted to the heat sink, they are mechanically separated from the front and rear panels which are located in the front and rear of the heat sink. With this arrangement, components disposed near the front and rear edges of the first and second chassis can be inspected and maintained without difficulty. In addition, since the printed circuit board can be easily removed from the chassis so as to expose the semiconductor module, inspection, maintenance or replacement of the semiconductor module is easy.

A window may be formed in the said at least one of said first and second chassis. The semiconductor module is disposed to protrude through the window toward the printed circuit board, whereby, when the printed circuit board is removed, the semiconductor module is exposed through the window, which facilitates inspection and maintenance of the semiconductor module.

The semiconductor module may be connected with a detachably connector to the printed circuit board, so that the printed circuit board can be readily removed.

The heat sink may be formed of two halves, which are preferably of the same shape. The two heat sink halves have a plurality of fins on their mating sides. Since the heat sink is formed of two halves, it can be easily manufactured. A heat sink may have fins which extend substantially horizontally and are vertically spaced. A single-unit type heat sink with such structure formed by drawing cannot have a large ratio of the length of the fins to the spacing between adjacent fins cannot be made large. In contrast, if such heat sink is formed from two halves with fins having abutting tip edges, the heat sink as a whole can have a large fin length-to-spacing ratio. If the heat sink is formed of two halves having the same shape and size, its manufacturing is also simplified.

A blower may be disposed between corresponding ends of the first and second chassis to thereby cool the heat sink. Since the heat sink is interposed between the first and second chassis, the chassis and the heat sink effectively provide a duct for air flow formed by the blower, so that the heat sink can be cooled efficiently.

The power supply circuit may include a transformer. The transformer is disposed beneath the heat sink and has portions thereof extending through the first and second chassis. Sometimes, a power supply circuit is provided with a transformer disposed between input and output sides of the circuit. According to the present invention, disposing the transformer beneath the heat sink can eliminate need for providing a space dedicated for the transformer. In addition, the transformer can be supported by the first and second chassis, no dedicated support for the transformer is required.

The transformer may be a thin or small-thickness transformer, requiring a smaller space in the power supply apparatus, which results in downsizing of the power supply apparatus. The thin transformer may include conductors formed of laminated thin conductor sheets with insulating sheets disposed between adjacent ones of the conductor sheets. The thin conductor sheet may be formed by cutting a metal conductor sheet into a loop-shape.

Two printed circuit boards may be used. A first one of the printed circuit board is detachably mounted to the first chassis, and the second printed circuit board is detachably mounted to the second chassis. The first printed circuit board includes an input side circuit portion of the power supply circuit, and the second printed circuit board includes an output side circuit portion of the power supply circuit. Separate semiconductor modules are used for the input and output side portions of the power supply circuit. The semiconductor module for the input side circuit portion is disposed on the surface of the heat sink facing toward the first chassis and extends to protrude through the first chassis toward the first printed circuit board, whereas the semiconductor module for the output circuit portion is disposed on the surface of the heat sink facing the second chassis and extends through the second chassis toward the second printed circuit board. With this arrangement, in order to inspect the semiconductor module for the input side circuit portion, the first printed circuit board only needs to be removed, and, similarly, in order to inspect the semiconductor module for the output side circuit portion, only the second printed circuit board needs to be removed. In addition, the protrusion of the semiconductor modules through the first and second chassis toward the respective printed circuit boards facilitates inspection and maintenance of the semiconductor modules.

A thin transformer may be provided between input and output side circuit portions of the power supply circuit. The transformer is disposed beneath the heat sink. The input side of the transformer is connected to the first printed circuit board, and the output side of the transformer is connected to the second printed circuit board. This arrangement requires a smaller space for the transformer, resulting in downsizing of the power supply apparatus, and also requires shortest wiring for the input and output sides of the transformer.

DETAILED DESCRIPTION OF THE EMBODIMENT

Figure 2:
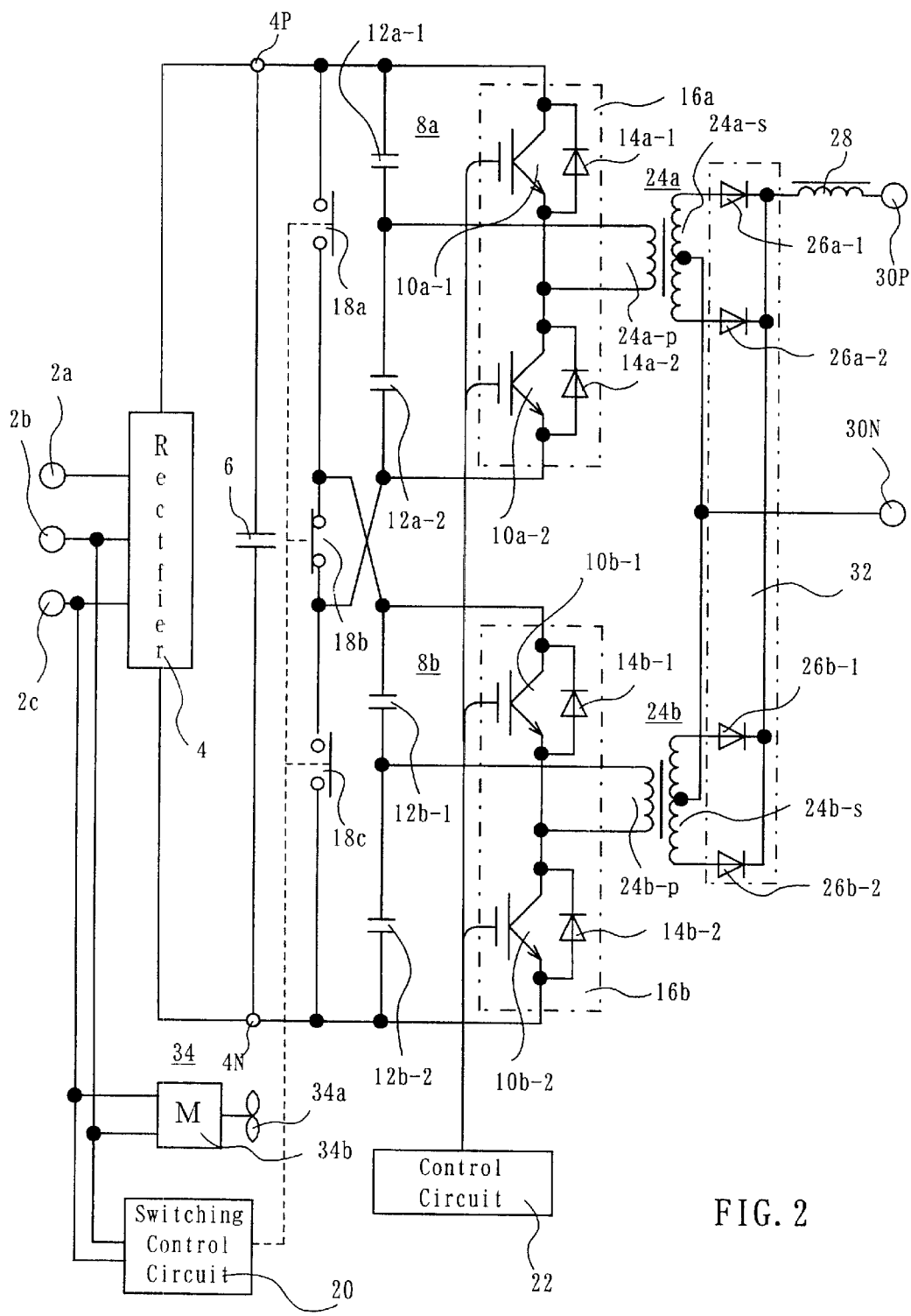
FIG. 2 is a circuit diagram of the power supply apparatus shown in FIG. 1.

As shown in FIG. 2, a power supply apparatus according to an embodiment of the present invention has power supply input terminals 2a, 2b and 2c, to which an AC power supply, e.g. a three-phase commercial AC power supply is adapted to be connected. In place of the three-phase AC power supply, a single-phase commercial AC power supply may be used. The commercial AC power supply provides a first voltage of, for example, 400 V, or a second voltage which is, for example, about one half of the first voltage, 200 V.

The input terminals 2a, 2b and 2c are coupled to input terminals of an input side rectifier 4. The input side rectifier 4 is formed of a plurality of rectifying diodes (not shown) connected to form a bridge and is formed in a semiconductor module. A smoothing capacitor 6 is connected between output terminals 4P and 4N of the input side rectifier 4. Although only one smoothing capacitor 6 is shown in FIG. 2, a plurality of capacitors connected in parallel are actually used.

The power supply apparatus includes two inverters 8a and 8b of the same configuration. Accordingly, only one of them, namely, the inverter 8a, is described in detail hereinafter, and detailed description of the other inverter 8b is not given. In FIG. 2, the components of the inverter 8b are given reference numerals used for the corresponding components of the inverter 8a, with the suffix "a" changed to "b".

The inverter 8a includes semiconductor switching devices. Each of the semiconductor switching devices has a conduction path of which conduction state is modified in response to the value of a control signal applied to its control electrode. In the circuit of FIG. 2, IGBTs 10a-1 and 10a-2 are used as the semiconductor switching devices. In place of IGBTs, power FETs or power bipolar transistors can be used. The IGBTs 10a-1 and 10a-2 have their collector-emitter conduction paths connected in series. A series combination of capacitors 12a-1 and 12a-2 is connected in parallel with the series combination of the collector-emitter conduction paths of the IGBTs 10a-1 and 10a-2. The inverter 8a is a half-bridge type inverter. The inverter 8a may be a full-bridge type inverter, with IGBTs substituted for the capacitors 12a-1 and 12a-2.

Flywheel diodes 14a-1 and 14a-2 are connected in an inverse-parallel connection with the collector-emitter conduction paths of the IGBTs 10a-1 and 10a-2, respectively. The IGBTs 10a-1 and 10a-2 and the flywheel diodes 14a-1 and 14a-2 form an inverter semiconductor module 16a. Similarly, IGBTs 10b-1 and 10b-2 and associated flywheel diodes 14b-1 and 14b-2 form an inverter semiconductor module 16b.

Switching means, for example, switches 18a, 18b and 18c are connected in the named order between the output terminals 4P and 4N of the input side rectifier 4, with the switch 18a connected closest to the output terminal 4P. The switches 18a–18c operate to connect the inverters 8a and 8b in series between the output terminals 4P and 4N when the first voltage of 400 V is applied to the power supply input terminals 2a–2c, and to connect the inverters 8a and 8b in parallel between the output terminals 4P and 4N when the second voltage of 200 V is applied to the power supply input terminals 2a–2c. The switches 18a and 18c are normally open, while the switch 18b is normally closed. The series combination of the capacitors 12a-1 and 12a-2 is connected in parallel with the series combination of the switches 18a and 18b, and a similar series combination of capacitors 12b-1 and 12b-2 is connected in parallel with the series combination of the switches 18b and 18c.

The switches 18a, 18b and 18c are controlled by a switching control circuit 20. The switching control circuit 20 receives a voltage applied between two of the power supply input terminals 2a, 2b and 2c. In the circuit shown in FIG. 2, the voltage between the power supply input terminals 2b and 2c is applied to the switching control circuit 20. For the input supply voltage of 200 V, the switching control circuit 20 closes the switches 18a and 18c and opens the switch 18b so that the inverters 8a and 8b are connected in parallel between the output terminals 4P and 4N. If the input supply voltage is 400 V, the switching control circuit 20 opens the switches 18a and 18c and closes the switch 18b so that the inverters 8a and 8b are connected in series between the output terminals 4P and 4N of the input side rectifier 4.

The IGBTs 10a-1 and 10a-2 and IGBTs 10b-1 and 10b-2 of the inverters 8a and 8b are controlled with respective control signals applied to them from a control circuit 22 through respective transmission lines. In FIG. 2, only one transmission line is shown for simplicity of illustration.

Outputs of the inverters 8a and 8b are coupled to input-side windings 24a-p and 24b-p of transformers 24a and 24b, respectively. Anodes of rectifying diodes 26a-1 and 26a-2 are connected to respective ends of an output-side winding 24a-s of the transformer 24a, and anodes of rectifying diodes 26b-1 and 26b-2 are connected to respective ends of an output-side winding. 24b-s of the transformer 24b. The cathodes of the diodes 26a-1, 26a-2, 26b-1 and 26b-2 are connected together to an output terminal 30P of the power supply apparatus through a smoothing reactor 28. The diodes 26a-1, 26a-2, 26b-1 and 26b-2 form an output-side rectifier. Intermediate taps are provided on the output-side windings 24a-s and 24b-s, and connected together to an output terminal 3ON of the power supply apparatus. The rectifying diodes 26a-1, 26a-2, 26b-1 and 26b-2 are formed in one semiconductor module 32.

A blower 34 is used to cool these components. The blower 34 includes a fan 34a and a motor 34b which drives the fan 34a. The motor 34b is supplied with power from two of the power supply input terminals, namely, terminals 2b and 2c in the example shown in FIG. 2.

Figure 1:
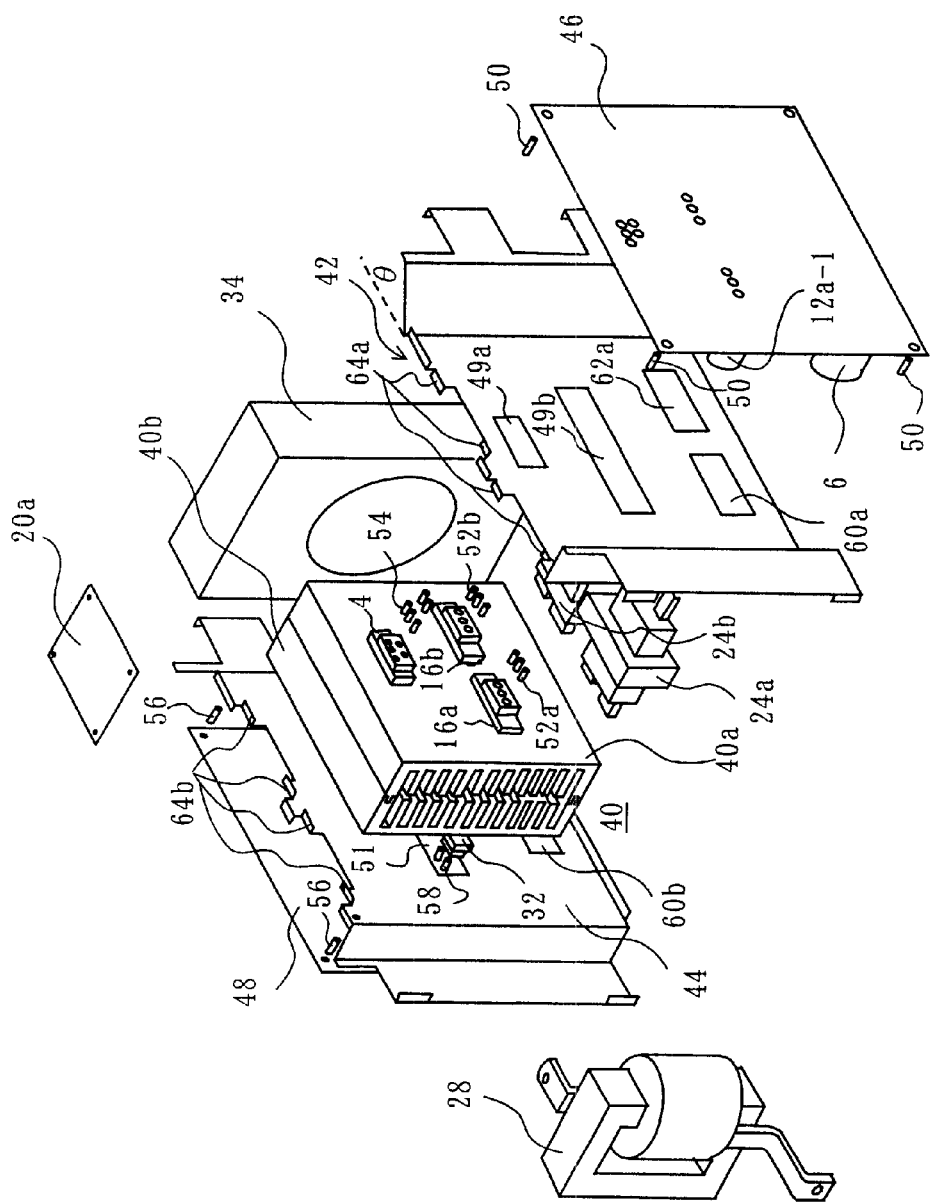
FIG. 1 is a exploded view of a power supply apparatus according to one embodiment of the present invention.
Figure 3:
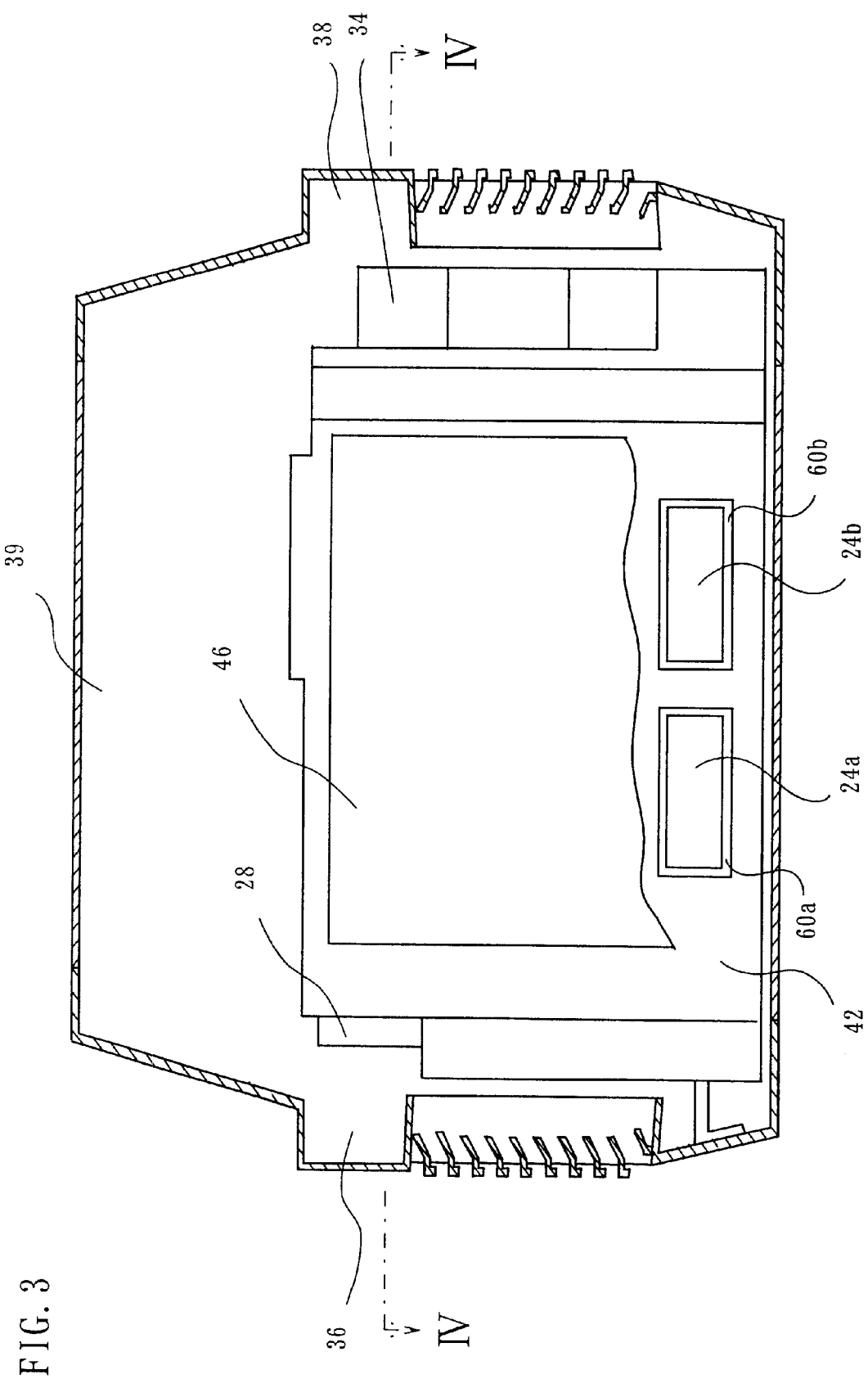
FIG. 3 shows the power supply apparatus of FIG. 1 with the right half of the side panel removed to show the internal structure and with part of a printed circuit board removed.
Figure 4:
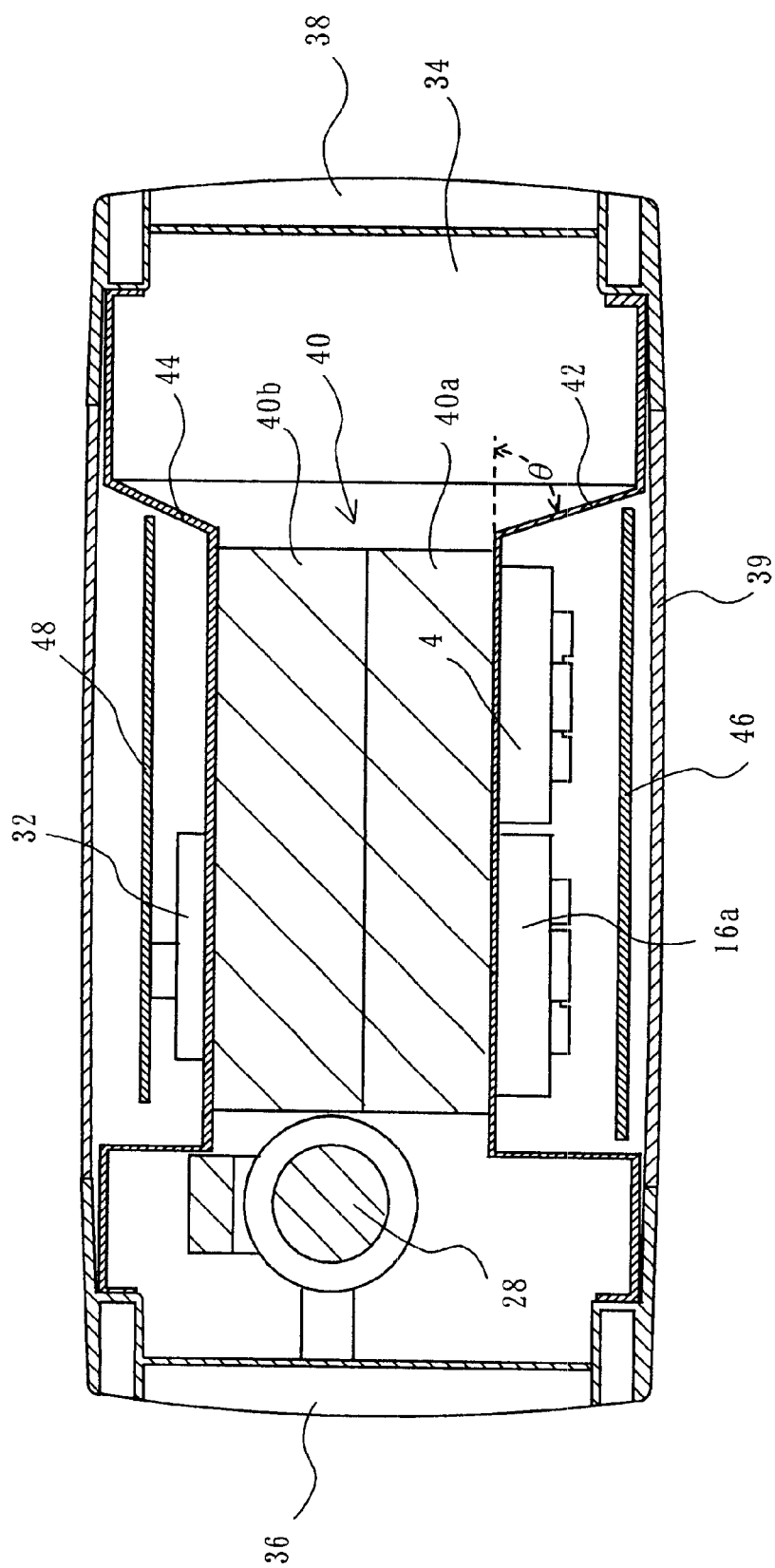
FIG. 4 is a cross-sectional view along a line IV—IV in FIG. 3.

As shown in FIGS. 3 and 4, these components are enclosed by a front panel 36, a rear panel 38, and a hollow, generally rectangular hull 39 which surrounds the space defined by and between the front and rear panels 36 and 38, to thereby form a case. The hull 39 may be formed of two left and right mating panels, or upper and lower mating panels, each having a U-shaped cross-section and having its respective open edges abutting against the corresponding edges of the mating panel. Within the case, an assembly including a heat sink 40 having heat dissipating fins, first and second chassis 42 and 44, and printed circuit boards 46 and 48, shown in FIG. 1, is disposed.

The heat sink 40 is a rectangular parallelepiped block, and has a plurality of vertically spaced fins extending horizontally between two inner side surfaces. The hollow spaces in the heat sink 40 defined between adjacent ones of the fins open toward the front and rear panels 36 and 38. In general, the heat sink 40 is drawn from aluminum. However, a heat sink with such structure cannot have a large tongue ratio, which is the ratio of the length of each fin to the distance between adjacent fins. Therefore, the heat sink 40 is formed of two halves 40a and 40b of the same shape and size each formed by drawing aluminum. The two heat sink halves 40a and 40b are joined together with the vertically extending tip end surfaces of the fins of one half abutting against the vertically extending tip end surfaces of the fins of the other half, so as to provide long fins. The heat sink halves 40a and 40b may be joined by welding. Alternatively, they may be tongue-and-groove joined, with a tongue in the upper edge of one half, e.g. 40a, inserted into a groove in upper edge of the other half 40b, and with a tongue in the lower edge of the heat sink half 40b inserted into a groove in the lower edge of the one half 40a. Therefore, the heat sink halves 40a and 40b should desirably have the same shape and size.

The input side rectifier 4 formed as a semiconductor module is detachably mounted on the outer side surface of the heat sink half 40a. The inverter semiconductor modules 16a and 16b are also detachably mounted on the outer side surface of the heat sink half 40a.

On the outer side surface of the heat sink half 40b, the output side rectifier semiconductor module 32 is detachably mounted.

In other words, the semiconductor modules 4, 16a and 16b which are in the input side of the power supply apparatus are mounted on the outer side surface of the heat sink half 40a, whereas the semiconductor module 32 which is used in the output side of the power supply apparatus is mounted on the outer surface of the heat sink half 40b.

The first chassis 42 is attached to the outer side surface of the heat sink half 40a, and the second chassis 44 is attached to the outer side surface of the heat sink half 40b. The first and second chassis 42 and 44 are formed of a thin plate of metal, e.g. aluminum or copper. The first and second chassis 42 and 44 have a height larger than the height of the heat sink halves 40a and 40b. The lower portions of the chassis 42 and 44 extend beyond the lower end surfaces of the heat sink halves 40a and 40b. The longitudinal dimension or length of each of the chassis 42 and 44, measured in the direction from the front to rear of the power supply apparatus, is longer than the length of the heat sink halves 40a and 40b, and the front and rear edges of the chassis 42 and 44 extend beyond the front and rear ends of the heat sink halves 40a and 40b, respectively. Those rear end portions of the chassis 42 and 44 which are more rearward of the rear ends of the heat sink halves 40a and 40b are bent outward by an angle of $\Theta$ as shown in FIGS. 1 and 4.

The first and second chassis 42 and 44 and the heat sink 40 provide a duct for blowing heat out of the power supply apparatus. The blower 34 is mounted between the outward bent rear end portions of the first and second chassis 42 and 44. Slits are formed in the front and rear panels as shown in FIG. 3. When the blower 34 is operated, air is taken in through the slits in the front panel 36, flows through the spaces between the fins of the heat sink 40 to thereby cool the semiconductor modules 4, 16a, 16b and 32 mounted on it, and goes out through the slits in the rear panel 38.

The first chassis 42 is provided with a window 49a at a location corresponding to a location on the heat sink half 40a where the input side rectifier 4 is mounted, and with a window 49b at a location corresponding to the locations on the heat sink half 40a where the inverter semiconductor modules 16a and 16b are mounted. The input side rectifier semiconductor module 4 protrudes outward through the window 49a, and the inverter semiconductor modules 16a and 16b extend outward through the window 49b. The second chassis 44 is also provided with a window 51 at a location corresponding to the location on the heat sink half 40b where the semiconductor module 32 is mounted, and the semiconductor module 32 extends outward through the window 51.

The printed circuit board 46 is disposed outward of the first chassis 42 with a spacing disposed therebetween, and detachably mounted to the first chassis 42 by means of supporting members 50. On the printed circuit board 46, disposed are those components used in the input sides of the transformers 24a and 24b, including the smoothing capacitor 6 and the capacitors 12a-1, 12a-2, 12b-1 and 12b-2 of the inverters 8a and 8b. In other words, the printed circuit board 46 may be called an input side printed circuit board. The input side rectifier 4 and the inverter semiconductor modules 16a and 16b, which are in the input side of the transformers 24a and 24b, must be electrically connected to components on the printed circuit board 46. This electrical connection is provided by directly fixing, by means of, for example, screws, metallic supporting members 52a, 52b and 54 to the printed circuit board 46, on one hand, and the inverter semiconductor modules 16a and 16b and the input side rectifier 4, respectively. The supporting members 52a, 52b and 54 are also adapted to be readily detachable.

The second printed circuit board 48 is disposed outward of the second chassis 44, being spaced from the chassis 44. The printed circuit board 48 is detachably mounted to the chassis 44 by means of supporting members 56. On the printed circuit board 48, those components including wiring patterns which are used in the output sides of the transformers 24a and 24b are disposed. Thus, the second printed circuit board 48 may be called an output side printed circuit board. Metallic support members 58 are fixed by means of, for example, screws, to required portions of the wiring pattern on the printed circuit board 48 and the semiconductor module 32. Thus, the supporting members 58 are also readily detachable.

The transformers 24a and 24b are arranged along the length direction of the power supply apparatus, beneath the heat sink 40, with the input side of each transformer facing the printed circuit board 46 and with the output side of each of the transformers 24a and 24b facing toward the printed circuit board 48. The input side windings 24a-p and 24b-p of the transformers 24a and 24b are inserted into and supported by windows 60a and 62a formed in the first chassis 42 at locations in a lower portion of the chassis 42 corresponding to the winding 24a-p and $^2$4b-p, respectively. Similarly, the output side windings 24 as and 24b-s are inserted into and supported by windows 60b and 62b formed in the second chassis 44 at locations in a lower portion of the chassis 44 corresponding to the windings 24a-s and 24b-s, respectively. The input side windings 24a-p and 24b-p are connected to appropriate circuit points on the printed circuit board 46, and the output side windings 24a-s and 24b-s are also connected to appropriate circuit points on the printed circuit board 48.

The transformers 24a and 24b may be of the type as described in Japanese Patent Application No. 2000-374552 filed on Dec. 8, 2000, from which U.S. patent application Publication No. U.S. 2002/0070836-A1 published on Jun. 13, 2002, claims priority. The transformer 24a and 24b are thin and each include a plurality of planar sheet coils with a slit formed therein to thereby provide each coil with two terminals. The planar coils are stacked with an insulating sheet disposed between two adjacent ones of the planar coils. The coils are connected in series by connecting first ends of the respective coils to second ends of adjacent coils, whereby the input side winding is formed. Similar coils are stacked and connected in parallel to form the output side windings. The input and output side windings are stacked, and a core is provided to extend through the space in the center.

The output side of the printed circuit board 48, i.e. a junction at which the cathodes of the output side rectifying diodes 26a-1, 26a-2, 26b-1 and 26b-2 are connected together, is connected to one end of the smoothing reactor 28 disposed forward of the heat sink 40. The other end of the reactor 28 is connected to the output terminal 30P of the power supply apparatus, which is disposed on the front panel 36. The output terminal 30N of the power supply apparatus is also disposed on the front panel 36, to which the intermediate taps on the output side windings 24a-s and 24b-s of the transformers 24a and 24b are connected.

Although not shown in FIG. 1, the control circuit 22 shown in FIG. 2 is formed on another printed circuit board, which is disposed beneath the printed circuit board 48 or 46, or above the heat sink 40.

Bends or shoulders 64a and 64b are formed in the upper edges of the chassis 42 and 44, respectively, to which a printed circuit board 20a with the switching control circuit 20 formed thereon is secured.

The front end portion of each of the chassis 42 and 44 is bent outward and, then, forward so as to increase its strength and also facilitate fixing of the front panel 36 thereto.

The front panel 36 is fixed to the front portions of the chassis 42 and 44, and the rear panel 38 is fixed together with the blower 34 to the rear portions of the chassis 42 and 44. After the front and rear panels 36 and 38 are secured to the front and rear panels 36 and 38, the hull 39 formed of two side panels or two upper and lower panels having a U-shaped cross-section is disposed between the front and rear panels 36 and 38 and secured to the chassis 42 and 44 by screws. These two side or upper and lower panels are formed, using the same mold.

With the above-described arrangement, the overall structure of the power supply apparatus can be seen by removing the screws fastening the hull 39 of the case to the first and second chassis 42 and 44, and separating the hull 39 into the two panels to open the case. Since the components on the input and output sides of the transformers 24a and 24b are on one and the other sides of the heat sink 40, respectively, all of the input side components, for example, can be inspected and/or repaired by a single inspection. The same is applicable to inspection of the output side components. In other words, there is no need to see the both sides of the heat sink 40 in order to inspect the components on only one of the input and output sides, which can reduce the time necessary for inspection and repair. Furthermore, in this arrangement, the first and second chassis 42 and 44 and the printed circuit boards 46 and 48 are secured to the heat sink 40 to form a single assembly. Accordingly, even when the front and rear panels 36 and 38 are unscrewed, they are never separated from one another. Also, With this arrangement, the components including the reactor 28 disposed near the front panel 36 can be easily inspected repaired.

Since the semiconductor modules 4, 16a and 16b extend through the windows 49a and 49b in the first chassis 42 and, therefore, can be exposed simply by removing the hull 39 and the printed circuit board 46, the replacement of these semiconductor modules with new ones can be done easily. In addition, the connections of the semiconductor modules 4, 16a and 16b to the printed circuit board 46 are provided by means of easily detachable supporting members 52a and 52b, which eliminates need for troublesome working like soldering and, therefore, facilitates manufacturing of the power supply apparatus. Because of the use of the easily detachable supporting members 52a and 52b, the semiconductor modules 4, 16a and 16b can be easily disconnected from the printed circuit board 46, which facilitates inspection and maintenance of these components. The same can be said with respect to the output side semiconductor module 32.

Since the transformers 24a and 24b are thin and mounted beneath the heat sink 40, they require no extra space for them, which makes it possible to downsize the apparatuses.

The present invention has been described by means of a power supply apparatus having an input which is adapted to receive either one of two relatively high and low AC supply voltages, but the power supply apparatus may be adapted to be supplied only with a single AC voltage. In such an arrangement, the switches 18a, 18b and 18c and the switching control circuit 20 are not necessary. Also, if the single AC voltage is a lower voltage, either the transformer 24a and the rectifying diodes 26a-1 and 26a-2, or the transformer 24b and the rectifying diodes 26b-1 and 26b-2 are removed. The described power supply apparatus is adapted to provide a DC current as its output, but it may be modified such that the output of the smoothing reactor 28 can be applied to a low-frequency inverter for conversion to an AC current of, for example, from 10 to 200 Hz, and the output of the low-frequency inverter can be outputted between the output terminals 30P and 30N. Alternatively, the apparatus can be modified such that the output of the reactor 28 and the output of the low-frequency inverter can be selectively supplied between the output terminals 30P and 30N. In this case, the low-frequency inverter is not operated as an inverter, but is used as a switch for coupling the DC current to the output terminals 30P and 30N.

What is claimed is:

1. A power supply apparatus comprising:
    first and second spaced apart chassis;
    a heat sink disposed between said first and second chassis, said first and second chassis being mounted to said heat sink;
    a printed circuit board detachably mounted to a surface of at least one of said first and second chassis opposite to a surface of said at least one chassis facing said heat sink; and
    at least one semiconductor module, said at least one, semiconductor module being mounted on the surface of said heat sink facing toward said printed circuit board and electrically connected to said printed circuit board to form a power supply circuit.

2. The power supply apparatus according to claim 1 wherein said semiconductor module protrudes through a window formed in said at least one chassis toward said printed circuit board.

3. The power supply apparatus according to claim 2 wherein said semiconductor module is connected to said printed circuit board with a detachable connector.

4. The power supply apparatus according to claim 1 wherein said heat sink is formed of two split members which are mated with each other to form said heat sink, each of said split members having a plurality of fins on their mating sides.

5. The power supply apparatus according to claim 1 wherein a blower is disposed between corresponding one ends of said first and second chassis.

6. The power supply apparatus according to claim 1 wherein said power supply circuit includes a transformer, said transformer being disposed beneath said heat sink and having parts thereof extending through said first and second chassis.

7. The power supply apparatus according to claim 6 wherein said transformer is small in thickness.

8. The power supply apparatus according to claim 1 wherein:
    first and second printed circuit boards are detachably mounted to said first and second chassis, respectively, said first printed circuit board including an input side circuit of said power supply circuit, said second printed circuit board including an output side circuit of said power supply circuit; and
    a first semiconductor module relating to said input side circuit of said power supply circuit and a second semiconductor module relating to said output side circuit of said power supply circuit are provided, said first semiconductor module being mounted on a surface of said heat sink facing said first chassis and extending through said first chassis to protrude toward said first printed circuit board, said second semiconductor module being mounted on a surface of said heat sink facing said second chassis and extending through said second chassis to protrude toward said second printed circuit board.

9. The power supply apparatus according to claim 8 wherein said power supply circuit includes a transformer, said transformer having a small thickness and being disposed beneath said heat sink, an input side of said transformer being connected to said first printed circuit board, an output side of said transformer being connected to said second printed circuit board.

* * * * *